United States Patent [19]
Paxton

[11] Patent Number: 5,727,016
[45] Date of Patent: Mar. 10, 1998

[54] SPATIALLY COHERENT DIODE LASER WITH LENSLIKE MEDIA AND FEEDBACK FROM STRAIGHT-TOOTHED GRATINGS

[75] Inventor: Alan H. Paxton, Albuquerque, N. Mex.

[73] Assignee: The United States of America as represented by the Secretary of the Air Force, Washington, D.C.

[21] Appl. No.: 628,563

[22] Filed: Mar. 26, 1996

[51] Int. Cl.[6] ............... H01S 3/10; H01S 3/19
[52] U.S. Cl. ............... 372/96; 372/45
[58] Field of Search ............... 372/92, 96, 50, 372/45

[56] References Cited

U.S. PATENT DOCUMENTS 5,164,956  11/1992  Lang ............... 372/96
5,345,466  9/1994  Macomber ............... 372/96
5,602,863  2/1997  Itagaki ............... 372/96

*Primary Examiner*—James W. Davie
*Attorney, Agent, or Firm*—Robert L. Nathans

[57] ABSTRACT

In a surface emitting semiconductor laser, a variable index of refraction layer having an approximately parabolically shaped trough therein is positioned adjacent the active lasing region and a straight toothed second order diffraction grating coacts with the refraction layer to produce a broad spatially coherent output beam.

9 Claims, 1 Drawing Sheet

SPATIALLY COHERENT DIODE LASER WITH LENSLIKE MEDIA AND FEEDBACK FROM STRAIGHT-TOOTHED GRATINGS

STATEMENT OF GOVERNMENT INTEREST

The invention described herein may be manufactured and used by or for the Government for governmental purposes without the payment of any royalty thereon.

BACKGROUND OF THE INVENTION

Diffraction gratings are frequently used to control the frequency of operation of semiconductor lasers. Examples of this type of laser are distributed feedback lasers and lasers with distributed Bragg reflectors. In a laser with a mode made up of counterpropagating diverging beams, in general, the rulings of the diffraction gratings must be curved to reflect one traveling wave into the other. See, for example, R. J. Lang, "Design of aberration-corrected curved mirror and curved-grating unstable-resonator diode lasers", IEEE J. Quantum Electron., Vol. 30, p. 31, 1994.

Surface emitting lasers have great promise for applications requiring high output power. A surface emitting distributed feedback semiconductor laser can produce higher output power than an edge emitting laser because a small fraction of the optical fluence in the waveguide reaches the facet, eliminating the main source of catastrophic optical damage in diode lasers at high power. The output from surface emitting lasers is spatially coherent if the width, or lateral dimension of the lasing region is limited to about 5 microns. To obtain high output power, however, it is advantageous to allow a lasing region with a width of 50 microns or more. Simply increasing the width leads to spatially incoherent operation. Thus, a method for fabricating a surface emitting laser with a wide lasing region and with a spatially coherent output beam is desired.

A semiconductor laser with a continuous unstable resonator has been described by Salvador Guel-Sandoval et al. in Appl. Phys. Lett., Vol. 66, pp 2048 to 2050, (1995). This paper demonstrated a means for inducing a quadratically varying index of refraction across the lateral dimension of a wide-stripe semiconductor laser, to cause beam divergence. This type of beam divergence causes coherent operation in the laser of the present invention.

A method for fabricating the grating for a distributed feedback semiconductor laser is disclosed by S. H. Macomber et at. in AppL. Phys. Lett., Vol. 51, pp 472 to 474, 1987. A gold coating is deposited on a grating etched into the p-side of the semiconductor laser. The gold coating serves as the p-contact for the laser.

BRIEF SUMMARY OF THE INVENTION

A laser mode of diverging counterpropagating travelling wave beams is generated by a gain layer near a variable index of refraction layer and the travelling wave beams coact with a straight toothed diffraction grating which produces first and second order Bragg diffraction resulting in a wide coherent output beam and sustained lasing.

BRIEF SUMMARY OF THE DRAWINGS

Other features and advantages of the invention will become apparent upon study of the following description, taken in conjunction with the drawings in which.

DETAILED DESCRIPTION OF THE PREFERRED EMBODIMENT

Figure 1:
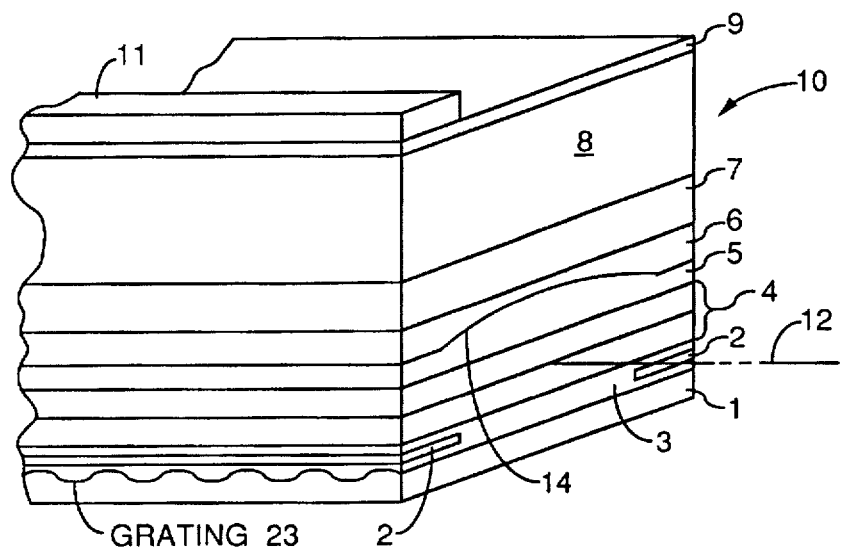
FIG. 1 illustrates a preferred embodiment of the laser of the invention.

A schematic drawing of the epitaxial structure of the preferred embodiment of the semiconductor laser 10 is shown in FIG. 1 and includes an AlGaAs structure with one or more InGaAs strained quantum wells comprising the active region 4. Layer 7, having a thickness of about 1.5 microns, is an n-doped $Al_{0.4}Ga_{0.6}As$ cladding that is grown on the crystalline substrate layer 8 of n+GaAs. Layer 6 is an n-doped GaAs layer that is grown with a thickness around 0.13 μm on top of layer 7. A smooth trough 14 with maximum depth of about 0.09 μm and width in the lateral dimension of about 220 μm is etched into this layer, so that the trough extends along the direction of longitudinal axis 12, parallel to the longitudinal dimension of the laser. The shape of the trough is selected to cause a parabolic variation of the effective index of refraction in the lateral dimension. See the S. Guel-Sandoval, paper cited above. Layer 5 consists of $Al_{0.4}Ga_{0.6}As$ regrown over the etched layer 6 with thickness of about 0.1 μm above the unetched part of Layer 6. This layer planarizes during regrowth.

Figure 2:
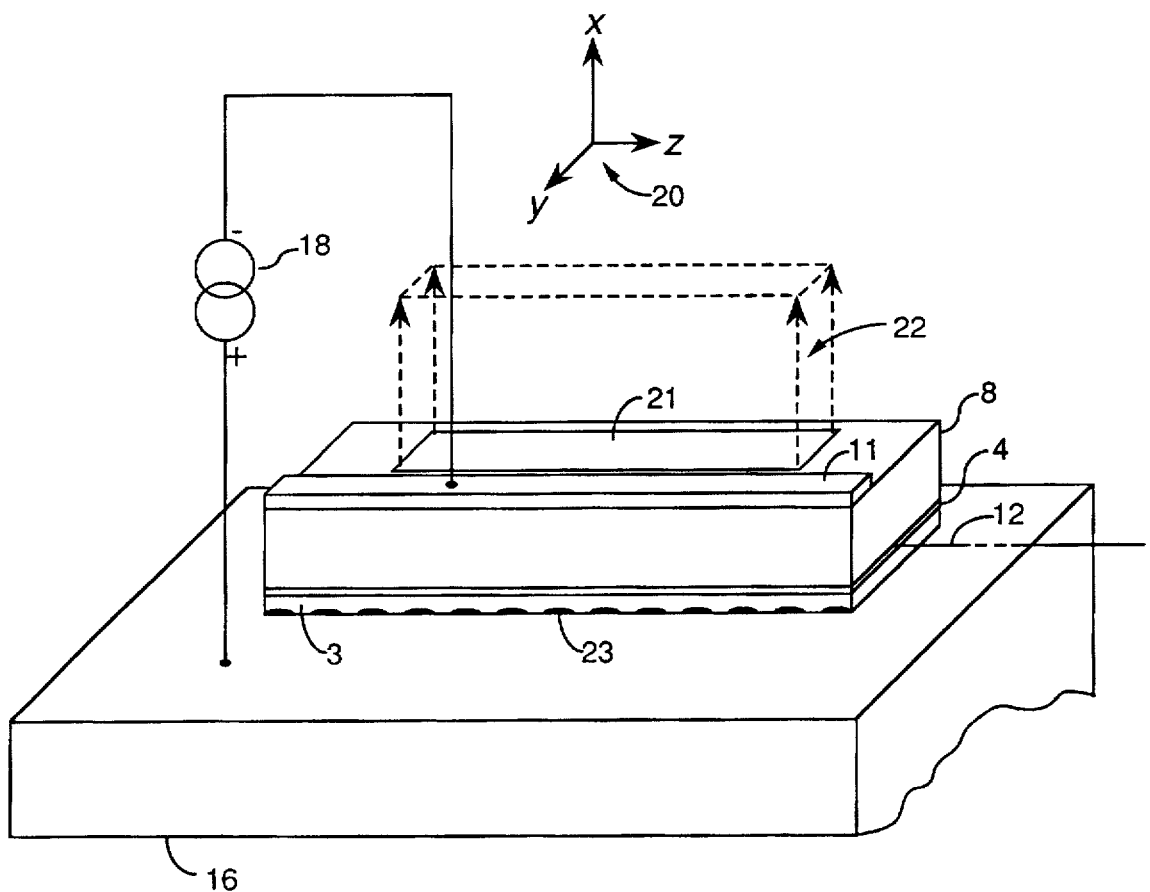
FIG. 2 illustrates the laser coupled to a heatsink and to a current source.

Active region 4 functions as an optical confinement and wide lasing region with one or more quantum wells within it. As an example, region 4 might consist of a graded $Al_2Ga_{1-x}As$ layer grown with a thickness of 0.1 μm on top of layer 5, graded from x=0.4 to x=0.2. Then one or more $In_{0.2}Ga_{0.8}As$ quantum wells are grown, with $Al_{0.2}Ga_{0.8}As$ spacers if multiple wells are used. Then, a 0.3 micron AlGaAs layer graded from x=0.2 to x=0.4 is grown. On top of region 4, a p-doped $Al_{0.4}Ga_{0.6}As$ cladding layer 3 of thickness 0.3 μm is grown and is etched to form a second order grating 23. The grating period is selected so that a condition for Bragg diffraction is satisfied by the effective index of refraction along a plane that is laterally centered in the laser. This plane intersects the bottom of the groove etched in layer 6 and is orthogonal to the junction plane. The effective index of refraction of the laser waveguide has the constant value $n_c$, along this laterally centered plane at longitudinal axis 12, but varies quadratically along the width (y dimension) of the laser with the highest value thereof at the side edges or noncentralized portions of the device and the lowest value at centralized portions along axis 12. Thus, $n=n_c+n_2 y^2$, where y is the lateral coordinate of coordinate axis 20 of FIG. 2. Semiconductor lasers with this distribution of the index of refraction are discussed in the Gruel Sandoval reference supra and in my paper IEEE J. Quantum Electron., Vol. 29, p.2784, (1993). The grating grooves 23 are spaced so that the second order Bragg diffraction feeds the waveguide mode traveling in the direction opposite to the incident waveguide mode. The value of the effective index of refraction used to calculate this resonant condition is $n_c$. The grating grooves are straight lines parallel to the junction plane and perpendicular to the laterally centered plane at longitudinal axis 12. Thus, the straight grating lines resonantly couple the two diverging traveling-wave beams that make up the laser mode, while an output beam 22 that is mildly astigmatic, shown in FIG. 2, is projected through the top of the laser in the x direction perpendicular to the plane of the wide lasing region under conducting stripe 21 of FIG. 2. The astigmatism is far less severe than that of the output beam of a typical edge emitting laser.

A conducting stripe 21 is defined by proton bombardment of regions 2 within layer 3 to destroy this layer's electrical conductivity outside the stripe. The stripe dimensions for this example are 150 μm wide along the lateral dimension, by 1.5 mm long. Region 1 is a gold layer which could be followed by Cr-Pt-Au layers. The laser can be considerably longer than the conducting stripe so that the optical fluence is small at the cleaved facets. For this example, thinning the substrate 8 by polishing to a thickness of about 80 μm is sufficient, since it is not absorbing at the lasing wavelength. An applicable technique for depositing a transparent contact 9 is disclosed by X. Wang et al. in Photonics Technology Lett., Vol. 8, January, 1996. The contact 9 is made from indium-tin-oxide (ITO), and is deposited by e-beam evaporation. A bonding pad 11 made from Ni-Au runs along one side of the laser. As shown in FIG. 2, a heatsink 16 is the positive contact for the laser, via the gold electrode region 1 of FIG. 1, and the negative contact is the Ni-Au bonding pad 11 shown on top of the laser. Foward biasing current source 18 is shown connecting these two contacts. Electrical power provided by the current source is converted to light by the lasing action in active region 4. The light propagates within the waveguide, in the longitudinal direction shown as the z-direction by the coordinate axes 20, where it is amplified by the lasing action. Diffraction due to the grating couples light going in the +z direction into the −z direction and vice versa. Light is also diffracted into the output beam of light 22 which is emitted in the x-direction through the transparent n-contact 9 of the laser. The lateral direction corresponds to the y-axis, and the transverse direction corresponds to the x-axis. The region through which the light is emitted is defined by the part of layer 3 of FIG. 1 that is left unbombarded, that is, layer 3 excluding the part of it that contains region 2. Bombardment by protons destroys the electrical conductivity of region 2, so that current only reaches region 4 above the unbombarded part of layer 3. To be exact, it spreads out slightly. The region in which electrical current can exist is called the current injection stripe, and light is emitted from an area 21 that is slightly larger than the current injection stripe.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A surface emitting semiconductor laser having a wide lasing region for producing a spatially coherent output beam comprising:
   (a) light wave generating means for producing a laser mode of diverging counterpropagating traveling wave beams of light within the wide lasing region of said semiconductor laser;
   (b) a straight toothed diffraction grating for resonantly coupling said diverging counterpropagating traveling wave beams that make up the laser mode together while diffracting light into an output beam transverse to said wide lasing region; and
   (c) a semiconductor layer coacting with said beams of light and having a variable effective index of refraction that varies quadratically in a direction transverse to said beams of light with the highest values thereof being at noncentralized portions of said laser and the lowest values at centralized portions of said laser.

2. The laser of claim 1 wherein said semiconductor layer produces said variable effective index of refraction by means of a trough formed therein.

3. The laser of claim 1 wherein said straight toothed diffraction grating is a second order grating.

4. The laser of claim 2 wherein said straight toothed diffraction grating is a second order grating.

5. A surface emitting semiconductor laser having a longitudinal and lateral dimension and a transverse dimension perpendicular thereto with a wide active lasing region perpendicular to said transverse dimension for producing a spatially coherent output beam comprising:
   (a) light wave generating means for producing a laser mode of diverging counterpropagating traveling wave beams of light within an active region of said semiconductor laser and along a centralized longitudinal axis parallel to said longitudinal dimension; and
   (b) a straight toothed diffraction grating for resonantly coupling said diverging counterpropagating travelling wave beams that make up the laser mode together, while diffracting light into an output beam transverse to said longitudinal axis; and
   (c) further including a semiconductor layer coacting with said beams of light and having a variable effective index of refraction that varies quadratically in a direction transverse to said longitudinal axis, with the highest values thereof being at noncentralized portions of said laser and the lowest values at centralized portions of said laser adjacent said centralized longitudinal axis.

6. The laser of claim 5 wherein said semiconductor layer produces said variable effective index of refraction by means of a trough formed therein.

7. The laser of claim 5 wherein said straight toothed diffraction grating is a second order grating.

8. The laser of claim 6 wherein said straight toothed diffraction grating is a second order grating.

9. A surface emitting semiconductor laser having a longitudinal and lateral dimension and a transverse dimension perpendicular thereto with a wide active lasing region perpendicular to said transverse dimension for producing a spatially coherent output beam comprising:
   (a) light wave generating means for producing a laser mode of diverging counterpropagating traveling wave beams of light within an active region of said semiconductor laser and along a centralized longitudinal axis parallel to said longitudinal dimension; and
   (b) a straight toothed second order diffraction grating having teeth extending perpendicular to said longitudinal axis for resonantly coupling said diverging counterpropagating traveling wave beams that make up the laser mode together, while diffracting light into an output beam perpendicular to said longitudinal axis; and
   (c) including a semiconductor layer coacting with said beams of light and having a variable effective index of refraction that varies quadratically in a direction perpendicular with respect to said longitudinal axis, with the highest values thereof being at noncentralized portions of said laser and the lowest values at centralized portions of said laser adjacent said centralized longitudinal axis.

\* \* \* \* \*